(12) United States Patent
Graf et al.

(10) Patent No.: US 7,746,482 B2
(45) Date of Patent: Jun. 29, 2010

(54) DETERMINING THE POSITION OF A SEMICONDUCTOR SUBSTRATE ON A ROTATION DEVICE

(76) Inventors: Ottmar Graf, Ravensburger Strasse 38, 88368 Bergatreute (DE); Michael Grandy, Blumenweg 1, 89250 Senden (DE)

( * ) Notice: Subject to any disclaimer, the term of this patent is extended or adjusted under 35 U.S.C. 154(b) by 142 days.

(21) Appl. No.: 11/597,178

(22) PCT Filed: Aug. 26, 2004

(86) PCT No.: PCT/EP2004/009531

§ 371 (c)(1),
(2), (4) Date: Apr. 10, 2008

(87) PCT Pub. No.: WO2005/114723

PCT Pub. Date: Dec. 1, 2005

(65) Prior Publication Data

US 2008/0316505 A1  Dec. 25, 2008

(30) Foreign Application Priority Data

May 21, 2004  (DE) .................. 10 2004 025 150

(51) Int. Cl.
*G01B 11/14* (2006.01)
(52) U.S. Cl. .................... 356/614; 356/622
(58) Field of Classification Search ............... 250/548, 250/442.11, 492.2, 202; 356/614–615, 399–400, 356/620–622; 414/935–941, 757, 217, 222.01–222.02
See application file for complete search history.

(56) References Cited

U.S. PATENT DOCUMENTS

| 5,121,531 | A |  | 6/1992 | Severns et al. |
| 5,252,132 | A |  | 10/1993 | Oda et al. |
| 5,381,233 | A | * | 1/1995 | Chao et al. ................. 356/369 |
| 5,405,230 | A |  | 4/1995 | Ono et al. |
| 5,563,798 | A | * | 10/1996 | Berken et al. ............... 700/218 |
| 5,683,518 | A |  | 11/1997 | Moore et al. |
| 5,848,889 | A |  | 12/1998 | Tietz et al. |
| 5,870,526 | A |  | 2/1999 | Aschner et al. |
| 5,965,047 | A |  | 10/1999 | Blersch et al. |
| 6,005,226 | A |  | 12/1999 | Aschner et al. |
| 6,222,990 | B1 |  | 4/2001 | Guardado et al. |
| 6,327,517 | B1 |  | 12/2001 | Sundar |
| 6,405,101 | B1 |  | 6/2002 | Johanson et al. |
| 6,449,428 | B2 |  | 9/2002 | Aschner et al. |
| 6,471,464 | B1 |  | 10/2002 | Fay et al. |

(Continued)

FOREIGN PATENT DOCUMENTS

GB  2 157078 A  10/1985

*Primary Examiner*—Gregory J Toatley, Jr.
*Assistant Examiner*—Tri T Ton
(74) *Attorney, Agent, or Firm*—Dority & Manning, P.A.

(57) ABSTRACT

A device for determining the position of a semiconductor substrate on a rotation device having a rotational axis, including a direction of rotation detecting unit for determining the rotational state of the rotation device, and also including at least one light source and at least one receiver which is photosensitive to the light from the light source, wherein at least one light beam emitted by the light source is directed toward the edge of the semiconductor substrate and passes said edge to at least a partial extent. The light of the light beam which has passed to at least a partial extent is then detected at least partially by the receiver.

19 Claims, 4 Drawing Sheets

U.S. PATENT DOCUMENTS

| | | |
|---|---|---|
| 6,752,625 B1 | 6/2004 | Aschner et al. |
| 6,770,146 B2 | 8/2004 | Koren et al. |
| 6,953,338 B2 | 10/2005 | Kreiser et al. |
| 7,041,610 B1 | 5/2006 | Tillmann et al. |
| 2001/0052392 A1* | 12/2001 | Nakamura et al. .......... 156/345 |
| 2005/0006916 A1 | 1/2005 | Mantz |

* cited by examiner

DETERMINING THE POSITION OF A SEMICONDUCTOR SUBSTRATE ON A ROTATION DEVICE

FIELD OF THE INVENTION

The present invention relates to a device and to a method for determining the position of a semiconductor substrate on a rotation device having a rotational axis.

BACKGROUND

The semiconductor substrates are preferably in the form of approximately round, disk-shaped substrates. The disk comprises a notch or at least one flat for denoting the orientation of the crystal, this thereby causing a deviation in the round disk shape of the substrate. The notch is in the form of a small nick that is produced in the edge of the semiconductor substrate (which is also referred to as a wafer), whilst the flat is in the form of a flattening of the edge of the wafer. In certain types of wafer, two such flattenings may also be formed, these being arranged at an angle with respect to one another. These days, semiconductor substrates of up to approximately 300 mm in diameter are used in the field of silicon technology.

During the many working steps utilised for the production of electronic circuits on a semiconductor substrate, the latter must also be positioned on rotation devices. Hereby, the rotation devices are preferably arranged within process chambers in order to enable the semiconductor substrate to be rotated during the processing step e.g. for the purposes of improving the outcome of the process with regard to uniformity across the cross section of the wafer. When using semiconductor substrates of 300 mm in diameter, the rotational speeds within the process chambers today amount to up to 150 revolutions per minute in dependence on the process being effected (e.g. in the case of rapid heating systems or so-called RTP plants). The semiconductor substrate is preferably placed on the rotation device by means of a robotic arm. Hereby, the semiconductor substrate preferably rests upon three quartz pins which are connected to the rotation device and form a tripod, said pins possibly being of different constructions in dependence on the process. Alternatively, the wafer is placed on a carrier ring, a so-called susceptor which is connected to the rotation device. Possible constructions of the quartz pins are described e.g. in the applicant's German patent application DE 100 03 639.2. Some further examples of holding devices for the semiconductor substrate such as susceptors for example are described in EP 0 821 403, U.S. Pat. Nos. 5,683,518 5,121, 531 and 5,252,132.

In the face of increasing demands in regard to the precision and reproducibility of the outcome from the process, it is important to position the semiconductor substrate (the wafer) on the rotation device in as precise a manner as possible. These days, different methods and techniques are used in order to achieve this requirement whereby the wafer is generally transported and positioned by means of robots. If the robotic arm has no sensor technology, then the robot must be programmed manually so that it will place the wafer on the rotation device at the correct position and then remove it again. Hereby, wafers are positioned and removed by an operator in a series of test runs during which the control co-ordinates for the robot are changed until such time as the result corresponds to the requirements. This is very time-consuming especially in those plants where the operator does not have direct access to the rotation device, e.g. if the rotation device is surrounded by a process chamber.

Apart from manually programming the robot, systems are also in use wherein the surrounding environment is measured by means of a sensor arrangement in order to move the wafer into the desired position using the measuring data. Other systems scan this environment by means of the robotic arm or the end effecter (a wafer holding device attached to the robotic arm for holding the wafer whilst it is being transported by means of the robot) by moving it slowly up to defined edges or objects in order to detect the rise in value of the motor current when it touches them. The position of the robotic arm or of the end effecter is stored when a motor current threshold value is reached. Measurement of the robot's environment and adjustment of the robot's movement within a known environment are thereby possible thus dispensing with a manual adjustment.

The procedures for programming the robot that have been described above exhibit some disadvantages. Thus, for example, the error rate is very high in the case of manual programming and is substantially dependent on the experience of the operator. In the case of the automated systems which measure the environment by means of sensors or by the rise in the motor current of the robot, it is generally necessary to have access to the object, i.e. here, to the rotation device. This is not always possible in practice, e.g. if the object is located within a process chamber e.g. an RTP chamber. A further crucial disadvantage is the fact that only a static measurement of the robot's environment can be effected by means of the aforesaid procedure, i.e. the exact position of a rotational axis with respect to fixed points of reference, e.g. the chamber walls of a process chamber, cannot generally be determined thereby. In general, requires a determination of the rotational axis rotation of the rotation device and thus operation of the plant. However, the exact position of the rotational axis cannot be determined using the aforementioned static procedures since the rotation device is not usually permitted to be in operation during the measurement of the robot's environment. Consequently, the relative position between the wafer and the rotational axis is also indefinite, this being something that can lead to the process having disadvantageous results and could lead to disturbances when in continuous operation.

SUMMARY

The object of the present invention is to eliminate the aforesaid disadvantages in regard to the determination of the position of the semiconductor substrate on a rotation device and to provide a device and a method which will permit the position of the semiconductor substrate on the rotation device to be determined automatically.

In accordance with the invention, this object is achieved by means of a device for determining the position of a semiconductor substrate on a rotation device having a rotational axis, which device comprises a direction of rotation detecting unit for determining the rotational state of the rotation device and furthermore comprises at least one light source and at least one receiver which is photo-sensitive to the light from the light source, wherein at least one light beam emitted by the light source is directed toward the edge of the semiconductor substrate and passes this edge to at least a partial extent, and wherein the light of the light beam which has passed to at least a partial extent is detected at least partially by the receiver.

By virtue of the device in accordance with the invention, the position of the semiconductor substrate relative to the rotational axis of the rotation device can be determined in an advantageous manner. Thereby, the rotation device can also be located in a place which is inaccessible to an operator, such as e.g. within a process chamber of a rapid heating system. Process chambers and rotation devices for rapid heating systems are described in the patent specifications U.S. Pat. Nos. 5,870,526; 6,005,226, 6,449,428 stemming from the applicant, and in the patent applications DE 19821007.8 and DE 199 52 017.8 for example.

In the device in accordance with the invention, a light source, preferably a laser light source such as e.g. a laser diode or generally a light emitting diode, illuminates the edge of the semiconductor substrate with a light beam in such a way that a part of the light beam passes the edge and a part thereof impinges on the semiconductor substrate. Preferably, virtually parallel light having a small angle of aperture of e.g. less than 15° is used. The cross-section of the light beam at the edge of wafer preferably amounts to between 2 mm and 6 mm. Furthermore, the light source may be followed by a suitable optical device consisting of lenses, mirrors, prisms and/or optical gratings which effect an e.g. wavelength selection process, produce divergence of the beam and/or have a beam collimating effect. That part of the light beam which passes the edge of the semiconductor substrate is detected by a suitable receiver which may likewise be preceded by a suitable optical device consisting of the previously mentioned elements. The receivers are preferably in the form of photosensitive semiconductor elements which can determine the position and/or the extent of the illuminated sensor position in addition to the intensity of the light such as is the case for an e.g. linear CCD array or CCD elements. It is not necessary for the receiver to detect all of the light that passes the edge of the wafer, it is sufficient to effect a partial detection thereof.

When the position of the semiconductor substrate is central relative to the rotational axis of the rotation device, the same fraction of the light beam that is directed towards the edge of wafer will always pass said edge when the wafer is being rotated due to its centralised position whereby the receiver will measure a constant intensity signal which is uninfluenced by the rotational speed. However, it should be mentioned that a notch or a flat (or two flats) which is present in the edge of the semiconductor substrate may cause the signal received by the receiver to deviate somewhat from its otherwise constant value during each revolution of the wafer. This deviation is characterised merely by a deviation over an angular range corresponding to the notch or the flat whereby such a marking in the wafer can be recognized. Usually, it is sufficient for the receiver to detect the light that is partly passing the edge of the wafer to only at least a partial extent. Consequently, any deviation of the position of the wafer from the central position with respect to the rotational axis can generally be detected.

The rotational state, i.e. the direction of rotation, the rotational speed and possibly the angle of rotation is determined by the direction of rotation detecting unit. This can be effected e.g. by means of a light barrier or a light barrier system on the rotation device using predominantly optical means, or by means of an appropriate pulse generator (working on an electrical, magnetic and/or mechanical basis) which is fixed to the rotational axis. Numerous forms of direction of rotation detecting units are known in the state of the art. The use of light barriers is described e.g. in the U.S. Pat. No. 6,449,428 which originates from the applicant.

If the position of the semiconductor substrate deviates from the central position with respect to the rotational axis, then the receiver measures a temporally varying intensity signal which varies at the rotational (angular) speed. Hereby, the variation in the signal represents a measure for the deviation of the position of the semiconductor substrate from the central position with respect to the rotational axis. This temporal variation in the intensity signal can be distinguished from the variation caused by a notch or by a flat by virtue of the fact that the variation extends over the entire angular range of a revolution, and is not, as mentioned above, limited to the narrow angular range of the notch or flats.

If the signal received by the receiver, or the temporal variations thereof, is correlated with the angle of rotation information from the direction of rotation detecting unit, then the relative displacement of the axis of the semiconductor substrate relative to the rotational axis can be determined in dependence on the angle. The data obtained in such a manner can be used for correcting the position of the semiconductor substrate on the rotation device.

The disadvantages specified above can be eliminated by means of the device in accordance with the invention, especially if the semiconductor substrate and/or the rotation device (or parts thereof) are surrounded by a process chamber, such as in RTP plants for example, in which the invention is preferably employed. The process chamber usually comprises a closable opening for loading and unloading the semiconductor substrate, whereby the substrate is generally transported through the opening by means of a robot.

The device in accordance with the invention can be used particularly advantageously for determining a position in plants wherein it is necessary to arrange at least one bearing of the rotational axis of the rotation device within the process chamber such as is depicted in e.g. U.S. Pat. No. 6,449,428 which originates from the applicant. Here, the semiconductor wafer is held on a rotation plate and spaced therefrom by means of three quartz pins, said plate likewise consisting of quartz. The rotation plate is preferably formed of two parts in order to prevent or minimize thermal stresses and thus deformation of the rotation plate. It consists of an outer ring which exceeds the diameter of the semiconductor substrate and amounts to about 400 mm. An inner quartz disk is arranged approximately centrally within this outer ring by means of three support elements so that the outer ring carries the inner disk. The inner disk has a diameter of about 300 mm and carries the quartz pins upon which the wafer is placed. In operation, the outer ring is raised somewhat by means of three air cushion bearings so that it can be made to rotate together with the inner quartz disk and the wafer in virtually friction-free manner. For the purposes of centring the rotation plate, an axle, which engages in a bearing, is attached to the inner disk at the centre thereof. The bearing for supporting the disk is likewise located on a quartz glass plate which is arranged below the rotation plate, and which furthermore, fixes the air cushion bearings and forms the lower boundary of the process chamber. The advantage of this construction is that it also enables the wafer to be heated through the rotation plate from below by means of lamps, said plate being accelerated or retarded by means of gas jets. A light barrier system serves as the direction of rotation detecting unit which determines the rotational state of the rotation device at the outer periphery of the rotation plate by means of appropriate structures, preferably teeth, that are located thereon. By virtue of the construction described, double-sided heating of the wafer can advantageously take place in that it is heated by the radiation produced by means of e.g. tungsten halogen bulbs from below and also from above, this likewise being effected through an upper quartz glass plate which bounds the process chamber.

Since the quartz glass plates have a size of about 50×50 cm, they are very expensive and must therefore be protected from destructive thermal stresses which would be unavoidable at these plate sizes in the case of rigidly clamped plates in an RTP plant. For this reason, the quartz glass plates are not connected rigidly to the side walls of the chamber which consist of metal (preferably aluminium), but rather, the plates are held between inflatable seals, these seals thereby providing space for thermal expansions. The quartz plates are thus mounted within limits in floating manner in the case of a gas-tight process chamber. This substantially reduces the danger of fracture of the quartz plates. The exact technical implementation of the mounting arrangement for the plate is described in the U.S. Pat. No. 5,870,526 originating from the applicant.

Due to the aforementioned floating mounting of the quartz plates, and in particular that of the lower plate which comprises the central bearing for the rotation device, a displacement of the central bearing can occur due to the effects of thermal expansion or stresses. This has the consequence that the wafer is no longer placed centrally on the rotation plate by the robot, i.e. the centre point of the wafer does not lie on the rotational axis, because the robot does not initially take into consideration the displacement of the central bearing. The consequence would then be an imbalance during rotation which could lead to the wafer being hurled off the rotation plate at higher rotational speeds.

Such a displacement of the central bearing can likewise be detected by the device in accordance with the invention since the receiver then detects a signal which varies at the rotational frequency. Consequently, the light beam passing the edge of the wafer varies due to the deviation between the axis of the wafer and the rotational axis. The position of the wafer relative to the rotational axis can be determined by means of the magnitude of the variation and by means of the angular dependency (as already expressed above). With a knowledge of this data, the robot can then be corrected in such a way that the next wafer will again be placed in a centred manner.

A deviation of the wafer axis from the axis of rotation of the rotary device not only produces a mechanical instability with the danger that the wafer will be hurled off the rotation device, but also has an effect upon the outcome of the process. Thus, even displacements between the rotational axis and the wafer axis of approx. 0.2 mm will become apparent in the outcome of the process in the case of certain processes. Consequently, it is also desirable to guarantee as good an alignment between the axes as possible in order to ensure reproducible results from the process. This can be achieved in an advantageous manner by the device in accordance with the invention, in that e.g. the position of the wafer relative to the rotational axis of the rotation device is determined prior to, during and/or after the execution of the process.

In a preferred embodiment of the invention, the light source and the receiver are arranged outside the process chamber, whereby at least one part of the light beam emitted by the light source is guided into the process chamber for the purposes of at least partially passing the edge of the semiconductor substrate through at least one opening that is optically transparent to the light of the light beam. By virtue of this arrangement, the effect is achieved that the light source and the receiver are decoupled from any variations in the position of the rotation device within the process chamber, and also that these can be recognized by the device in accordance with the invention. Consequently, the variation in the position of the rotation device within a process chamber and also the position of the wafer (the semiconductor substrate) relative to the rotational axis of the rotation device can be determined separately. An advantage of the device in accordance with the invention resulting therefrom, is that when determining the wafer position and the position of the axis of the rotation device e.g. after the processing of the wafer, these positions can be taken into consideration by the robot during the withdrawal of the wafer in such a way that the wafer can be removed from the process chamber at a defined known position and made available for subsequent treatment without the need for renewed measurement of the wafer in regard to its position with respect to the robotic arm or to a wafer holding device attached thereto (such as an end effecter). Methods and devices which measure the wafer (the centre of the wafer) in regard to its position with respect to e.g. the robotic arm or with respect to an end effecter attached thereto are described e.g. in the patent specifications U.S. Pat. Nos. 6,405,101 and 6,327,517. Such methods can be dispensed with by using the device in accordance with the invention. Furthermore, the separate determination of a possible alteration in the position of the rotational axis within the chamber and a possible alteration of the position of the wafer relative to the rotational axis offers additional possibilities for fault-tracing and subsequent correction of the robot. Thus, for example, mechanical variations in the spacing between the process chamber and the robot can be detected separately from a displacement of the rotational axis within the process chamber. This is particularly helpful in the case of production plants which are in almost continuous operation in order to guarantee high reproducibility in the outcome of the process.

The variation in the position of the rotation device, which also entails a displacement of the rotational axis, can be detected quantitatively by employing spatially resolving receivers incorporating spatially resolving elements, e.g. CCD elements which permit spatial resolution to be effected in at least one direction. When using a spatially resolving receiver in the case of a rotating wafer, both a displacement of the rotational axis (with respect to the receiver and/or the position of the light source) and a relative displacement between the centre of the wafer and the rotational axis can be determined whereby both displacements can easily be separated from one another.

Consequently, the variations of the rotational axis within the process chamber (or with respect to some other fixed point of reference) due e.g. to thermal expansion and also variations in the position of the wafer on the rotation device can be taken into consideration when correcting the movements of the robot. The latter effects are likewise essentially due to the thermal expansion of the wafer and that of the rotation device because in the case of hot processes during which the wafer is heated within seconds to over 1000° C., a 300-mm wafer will expand by approximately 1 mm and will then shrink again by approximately the same amount when it is removed from the process chamber at a lower temperature of between 300° C. and 700° C.

As has already been mentioned above, the device in accordance with the invention is preferably employed in plants wherein a robotic arm incorporating a holding device for the semiconductor substrate positions the latter on the rotation device and also removes it again. Hereby, more than one robot could also be used to feed the rotation device with semiconductor substrates, or, one robot (or robotic arm) could be responsible for loading and another for unloading. Preferably, the wafer holding device used when unloading from the process chamber of an RTP plant differs from the one that was used for loading the process chamber. This enables e.g. unloading to be effected at a substantially higher wafer temperature (of up to 700° C.) if, for example, the holding device is an end effecter made of quartz or sapphire, whereas the wafer is usually cold or exhibits temperatures of less than 300° C. during the loading of the chamber. In this latter case, an e.g. edge gripping device made of metal (e.g. aluminium) could be used as is described in the applicant's as yet unpublished provisional application U.S. Pat. No. 60/483,425.

Preferably, the semiconductor substrate is surrounded at least in sections, although preferably completely, by an approximately ring-shaped object, a so-called guard ring which, when processing silicon wafers, preferably also consists of silicon and has an additional coating as well. The ring-shaped object is preferably arranged rigidly in the process chamber so that the wafer rotates relative to this object. Preferably, the distance between the edge of the wafer and the ring-shaped object amounts to a few millimetres, whereby the ring-shaped object is usually arranged in a plane in the proximity of the plane of the wafer and is parallel thereto. The light beam passing the edge of the semiconductor substrate preferably shines through onto the receiver between the semiconductor substrate and the ring-shaped object.

As an alternative to the quartz pins described above, the semiconductor substrate could be held on the ring-shaped object, upon which it rests at its boundary region. Here, one speaks of a susceptor which serves as a wafer support and which, in this case, is caused to rotate with the rotation device. The susceptor is connected to the rotation device. Since the susceptor generally overlaps the edge of the semiconductor substrate, the receiver in the device in accordance with the invention is preferably arranged on the same side of the semiconductor substrate as the light source. In essence, the receiver then measures the light reflected from the edge of the semiconductor substrate and/or from the susceptor. In this case too, a displacement of the rotational axis (within the chamber) and/or a relative displacement of the wafer with respect to the rotational axis can be determined in a manner similar to that expressed above, whereby the data can then be used for correcting the positioning of the wafer by means of the robot.

In a further preferred embodiment, the device in accordance with the invention comprises a modulating device which produces a light beam that is deliberately varied over time e.g. in intensity, whereby the receiver signal from the light beam that is detected by the receiver is demodulated by means of a demodulating device. Due to the modulation process, the light of the light source can be distinguished from other sources which are interfering with the measurement. The sources of interference could, in particular, be the halogen bulbs which serve for heating the rapid heating system. Preferably, a modulating frequency for the light source is selected which does not otherwise arise in the plant and which is likewise different from the rotational frequency.

In a further preferred embodiment of the invention, the device comprises a processing unit which receives a receiver signal that is produced by the receiver and is related to the light beam detected thereby, whereby the processing unit provides an output signal which is a measure for the position of the semiconductor substrate relative to the rotation device, and/or represents a measure for the position of the rotational axis relative to the position of the light source (or the receiver) or relative to another point of reference. As described above, a robot used for the purposes of transporting the semiconductor substrates can be controlled by the processing unit by means of a control unit in accord with the output signal. A correction can generally be applied to a substrate transporting and/or a substrate holding device. Other units such as e.g. the rotation device itself can likewise be controlled and/or regulated by the output signal.

In a further preferred embodiment of the invention, at least two receivers are arranged at an angle relative to the rotational axis of the rotation device (in the direction of rotation). Consequently, in the case of e.g. non-spatially resolving receivers, the ratios of the receiver signals can be determined, these ratios representing a measure for any possible variation of the position of the rotational axis. When using spatially resolving receivers, a displacement of the rotational axis in a plane perpendicular to the rotational axis can be determined quantitatively, whereby the receivers are then preferably arranged at 90° when there are two of them.

In a further preferred embodiment of the invention, the splitting of the light beam emitted by the light source into at least two partial light beams is effected by at least one beam splitter means. This embodiment is preferred for example, if a ratio is to be formed from the received signals for determining the displacement of the rotational axis as was described in the case of the last embodiment.

Alternatively or additionally, further pairs of light sources and receivers can be used for the production of partial light beams so that at least two such pairs are present, these pairs being arranged at an angle relative to the rotational axis (in the direction of rotation).

In a further preferred embodiment of the invention, there is comprised at least one detection unit consisting of a transmitter and a receiver which is spaced from the rotation device in such a manner that it is not affected by a semiconductor substrate positioned on the rotation device. As described in the U.S. Pat. Nos. 6,405,101 and 6,327,517, such detection units can serve for determining the centre of the wafer, and in particular, for determining the position of the wafer on a wafer transporting device such as e.g. a robotic arm (possibly incorporating an end effecter). Hereby, the detection unit is preferably arranged in such a way that, when loading and/or unloading the rotation device, the semiconductor substrate passes the detection unit in such a manner that said unit will produce at least one signal due to the passing semiconductor substrate. The position of the wafer or the centre of the wafer on the wafer transporting device can then be determined by means of this signal. Consequently, the wafer can be precisely positioned within further process chambers by means of the wafer transporting device.

In the embodiments of the invention described so far, it is essential that the angle of incidence of the light beam on the receiver be defined i.e. that this angle of incidence does not vary at least whilst a measurement is being made, or at least that it only varies in a known manner. The same reasoning applies to the intensity of the light beam, it should have a defined beam profile during the measurement. The beam profile is to be understood as being the intensity distribution over a cross section of the light beam. This beam profile is preferably constant during the measurement, or however, a possible temporal or spatial variation must be known (such as is the case for a modulation of the intensity for example).

Furthermore, the object of the present invention is achieved by the method in accordance with the invention, wherein for the purposes of determining the position of a semiconductor substrate on a rotation device using a direction of rotation detecting unit for determining the rotational state of the rotation device, at least one light beam passes the edge of the semiconductor substrate to at least a partial extent, and wherein the light of the light beam which has passed said substrate to at least a partial extent is detected at least partially by a receiver.

Preferably, at least during the process of detecting the position of the semiconductor substrate, the light beam is defined in regard to its angle of incidence on the receiver and in regard to its beam profile.

Preferably, during the process of detecting the partially passed light beam, the semiconductor substrate is rotated through at least one revolution by the rotation device. If the semiconductor substrate is positioned in a process chamber, then its position is preferably determined before and/or during and/or after the execution of a process by virtue of the at least partial detection of the light beam by the receiver. Preferably, a semiconductor transporting device such as e.g. a robot is corrected in regard to the transportation path of the semiconductor substrate on the basis of the values from the receiver.

BRIEF DESCRIPTION OF THE DRAWINGS

The present invention is described hereinafter by means of the following Figures on the basis of the special exemplary embodiments. Hereby.

DETAILED DESCRIPTION OF THE DRAWINGS

Figure 1:
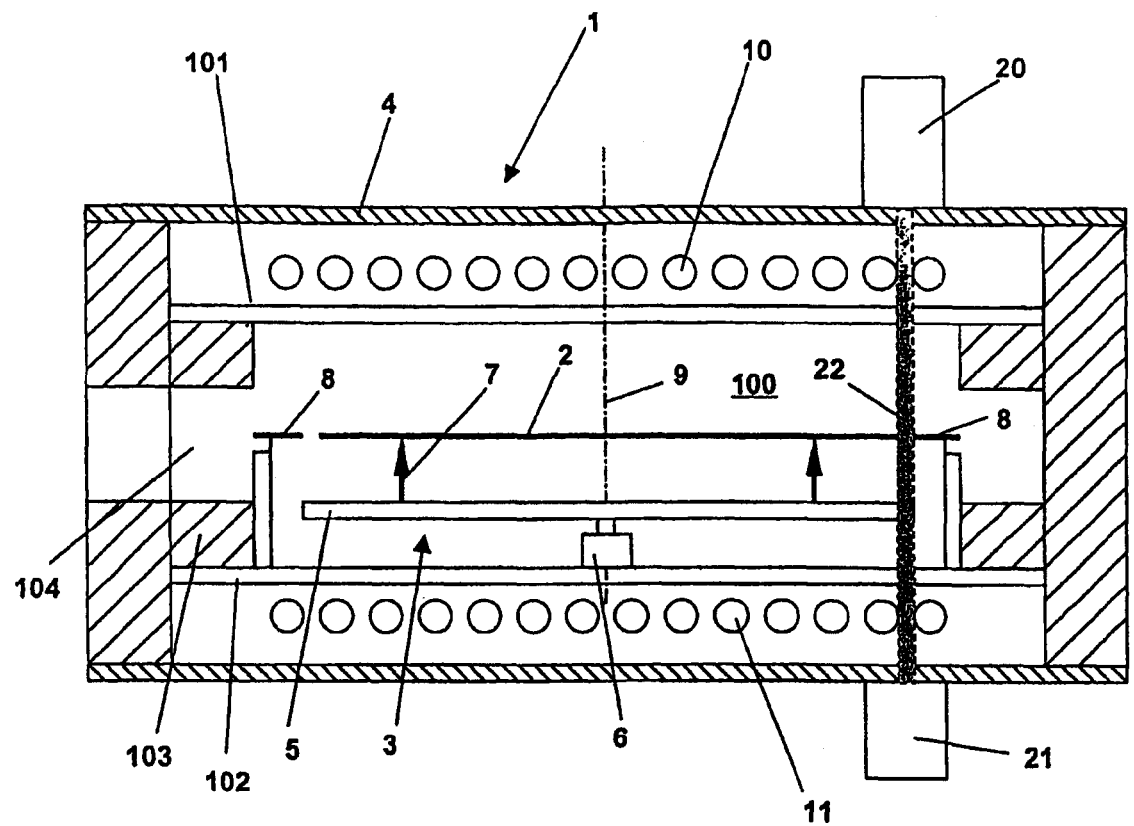
FIG. 1: shows a schematic cross section through an RTP chamber including a preferred arrangement of the light source and the receiver for determining the position of a wafer on a rotation device.

FIG. 1 shows a schematic cross section through a chamber 1 of an RTP plant (a rapid heating system) incorporating an upper lamp bank 10, a lower lamp bank 11, the process chamber 100, the light source 20 and the receiver 21 for determining the position of a semiconductor substrate (a wafer) 2 on a rotation device 3.

The process chamber 100 and the lamp banks 10 and 11 are surrounded by an outer chamber 4. The lamp banks 10 and 11 comprise a plurality of tungsten halogen bulbs which serve for heating the wafer. The wafer is located within a process chamber 100 which is bounded above and below by the quartz plates 101 and 102. The quartz plates are transparent to the radiation from the lamps in the lamp banks so that the wafer can be subjected to a specific temperature-time process in an adjustable gas atmosphere by means of this radiation. The process chamber 100 defines as small a processing volume as possible so as, for example, to keep the quantity of possible process gases used during the processing of the wafer low and also to minimize any possible impurities. Furthermore, only those devices that are absolutely necessary for carrying out the process are contained in the process chamber 100 in order to reduce the impurities in the wafer on the one hand and to minimize the amount of material that is subjected to the extreme processing conditions on the other. The lamp banks 10, 11 are therefore located outside the process chamber 100. The upper and the lower quartz plates 101 and 102 are also heated by the radiation from the lamps in the lamp banks 10, 11. In order to prevent the development of thermal stresses in these plates which could result in the destruction of the plates, the plates 101 and 102 are coupled to the chamber 1 at their boundary regions by means of inflatable seals (not illustrated). These seals seal off the process chamber both inwardly and outwardly and form a kind of floating bearing for the plates so that any thermal expansions of the plates or of the chamber 1 will be balanced out by these seals. For the purposes of abbreviating the description in regard to the use of such inflatable seals, reference is made to the patent specification U.S. Pat. No. 5,870,526 originating from the applicant.

The process chamber 100 is bounded laterally by a metal ring 103 which includes at least one closable opening 104 for the purposes of loading and unloading the process chamber 100, said opening being closed during the thermal processing of a wafer.

Within the process chamber 100, there is a rotation device 3 which comprises a rotor 5 that is supported centrally on the lower quartz plate 102 by means of a central bearing 6 which defines the rotational axis 9. Air cushion bearings (not illustrated) are provided in the boundary region of the rotor for supporting the rotor in floating manner on air cushions whilst it is rotating. The air cushion bearings are likewise provided on the lower plate 102. Furthermore, the rotor is usually in two-part form (not illustrated) in the case of plants used for the processing of 300 mm wafers and it comprises an outer ring that carries an inner disk upon which there are provided quartz pins 7 for supporting the wafer 2. This division of the rotor reduces the deformations of the rotor caused by thermal stresses, especially in the vicinity of the air cushion bearings so that the functioning thereof is not impaired. For the purposes of abbreviating the description, reference should be made to the patent specification U.S. Pat. No. 6,449,428 originating from the applicant wherein the rotation device is described in greater detail.

For the purposes of improving the homogeneity of the results obtained from the process, the periphery of the wafer 2 is surrounded by a ring-shaped object 8 (the guard ring 8). The guard ring 8 does not usually participate in the rotational action and it is mounted in a spaced relation, approximately 2 mm away from the wafer 2 in the proximity of its edge. The guard ring 8 does not have to lie in the same plane as the wafer 2, although it is preferably arranged in a plane that is parallel to the plane of the wafer.

Furthermore, the RTP chamber 1 shown in FIG. 1 comprises a light source 20 and a receiver 21 that is sensitive to the light from the light source 20. The light source 20 and the receiver 21 serve for determining the position of the wafer 2 on the rotation device 3 and for detecting any possible alterations in the position of the rotational axis 9. The light source 20 and the receiver 21 are preferably fixed to the chamber 1 and form an eccentricity sensor. The chamber 1 comprises openings for the entry and exit of the light 22 emitted by the light source 20 so that at least one light beam 22 emitted by the light source 20 will irradiate the edge of the wafer 2 and can pass it to at least a partial extent, whereby the light of the light beam 22 which has passed the edge to at least a partial extent will be at least partially detected by the receiver 21. In the embodiment illustrated in FIG. 1, the light beam 22 shines through the gap between the wafer 2 and the guard ring 8, whereby the light beam 22 preferably has a diameter of approximately 5 mm at the position of the wafer, although the distance between the guard ring and the wafer only amounts to about 2 mm to 3 mm.

If the wafer 2 is located centrally relative to the rotational axis 9, then the distance between the wafer 2 and the guard ring 8 will not vary during the rotation. Consequently, the same fraction of the emitted intensity gradient will always arrive at the receiver in the case where the intensity gradient of the emitted light beam 22 is known. This fraction of the emitted intensity is then converted into an electrical signal in the receiver 21 by means of a transfer function. Preferably, this transfer function is a linear function which converts the light intensity falling on the receiver 21 into an e.g. electrical voltage signal in a linear manner.

If the light source 20 emits a light beam that is constant in regard to the intensity thereof, then the receiver 21 always measures a fraction of the intensity emitted by the light source. This fraction is determined essentially by the screening effect of the wafer 2 and the guard ring 8 since these elements limit the cross section of the light beam 22. Furthermore, the attenuation of the light beam during its passage through the openings in the chamber 1, through the quartz plates 101 and 102, as well as during the passage thereof through the rotor 5 consisting of quartz also has a slight effect on the fraction of the intensity arriving at the receiver. These influences always reduce the intensity arriving at the receiver by a constant amount independently of the position of the wafer on the rotation device.

If the light source 20 should emit a light beam that is modulated in regard to the intensity thereof in order to enable the light from the light source 20 to be distinguished from any possible background radiation, then, as has already been described above, a fraction of the emitted light beam will arrive at the receiver 21 when the wafer is positioned centrally, although this light will likewise follow the intensity gradient of the emitted light beam. This intensity gradient is converted into an electrical signal in accord with the transfer function of the receiver 21. Thus, in the case of a linear transfer function, the e.g. electrical voltage of the receiver 21 follows the modulation of the light beam 22 i.e. that of the light source 20.

If the wafer 2 is not located on the rotation device 3 centrally with respect to the rotational axis 9, then the distance between the edge of the wafer and the guard ring 8 will vary in the area covered by the light beam 22 when the wafer 2 is being rotated by the rotation device 3 so that the light beam will experience a delimitation thereof which alters at the rotational frequency of the wafer 2. As a consequence thereof, a fraction of the intensity emitted by the light source 20 that is varying at the rotational frequency will arrive at the receiver 21. Hereby, the magnitude of the amplitude of the varying fraction is a measure for the amount of eccentricity, i.e. a measure for the deviation of the wafer from its centred position. The position of the wafer 2 relative to the rotational axis 9 of the rotation device 3 can thus be determined. However, it should also be mentioned that the guard ring 8 could be dispensed with for determining the position of the wafer. In this case, the cross section of the light beam 22 emitted by the light source 20 is limited only by the wafer.

If, for example, a displacement of the rotational axis 9 should occur during the operation of the plant due the central bearing 6 being displaced as a result of thermal expansion of the chamber 1 and/or of the lower quartz plate 102, then such a displacement can also be detected by means of the device in accordance with the invention. In particular, such a displacement is possible due to the above mentioned floating support of the quartz plates 101, 102 by means of the inflatable seals. If a displacement of the rotational axis 9 within the chamber 1 should occur, then this would entail a deviation from the central position during the placement of a wafer 2 if an appropriate correction were not to be effected for the robot which is positioning the wafer 2.

If a receiver 21 in the form of a spatially resolving receiver such as an e.g. CCD receiver is used, then a displacement of the rotational axis 9 can be established and determined quantitatively by virtue of a variation in the illuminated surface area of the receiver in the case where a wafer 2 is centred on the rotation device 3. The illuminated cross section of the surface area of the receiver increases or decreases in dependence on the displacement of the axis 9. Conclusions can be drawn therefrom in regard to the displacement of the rotational axis. If the displacement of the axis 9 takes place in a radial direction with reference to the light beam 22, then the arrangement of the light source 20 and the receiver 21 illustrated in FIG. 1 provides the greatest sensitivity for the measurement of such a displacement. If the displacement takes place in a tangential direction with reference to the light beam 22, then the arrangement of the light source 20 and the receiver 21 illustrated in FIG. 1 provides the lowest sensitivity. In order to obtain the requisite sensitivity for this direction of displacement of the axis 9 too, a second measuring arrangement of a light source and a receiver can be placed at an angle (preferably of 90° with reference to the rotational axis 9) to the first measuring arrangement consisting of the light source 20 and the receiver 21. Alternatively, just one light source 20 could also be used rather than two separate measuring arrangements, the beam of light emitted by said one light source being divided and then applied to two receivers 21 arranged at an angle of 90° relative to one another around the periphery of the wafer 2. However, any other arbitrary angle could also be selected. In general, more than two receivers 21 or light source and receiver units 20-21 could also be arranged around the periphery of the wafer 2.

If the wafer 2 does not rest centrally upon the rotation device 3 and if a displacement of the rotational axis 9 takes place, then the illuminated cross section of the surface area of the receiver increases or decreases as described above, although this increase or decrease is also overlaid by a periodic increase or decrease corresponding to the rotational frequency.

If only one intensity-sensitive sensor without spatially resolving elements is used, then a displacement of the rotational axis 9 can be determined by means of an exact determination of the absolute value of the measured intensity. However, as the axial displacements are very small (within a range of some tenths of a millimetre), very precise measurements are necessary for this purpose and these will only provide a very inaccurate picture due to the effects of interference. However, if the light beam emitted by the light source 20 is divided into at least two partial light beams e.g. by means of a beam splitter and if these beams are then passed to two intensity-sensitive receivers arranged at an angle with respect to the rotational axis 9, then (in the case of a centred wafer) a displacement of the rotational axis 9 can be concluded if there is an alteration in the ratio of the partial light beams falling on the receivers. In the case of two partial light beams, the angle is preferably 180, i.e. the partial light beams are arranged opposite one another with respect to the rotational axis 9. In order to enable the direction of the axial displacement to be determined more precisely, several partial light beams can be produced which are then directed toward a respective unique receiver 21, these receivers being arranged around the periphery of the wafer 2. The displacement of the rotational axis can then be determined from the ratio formed from the measured intensity values.

Figure 2:
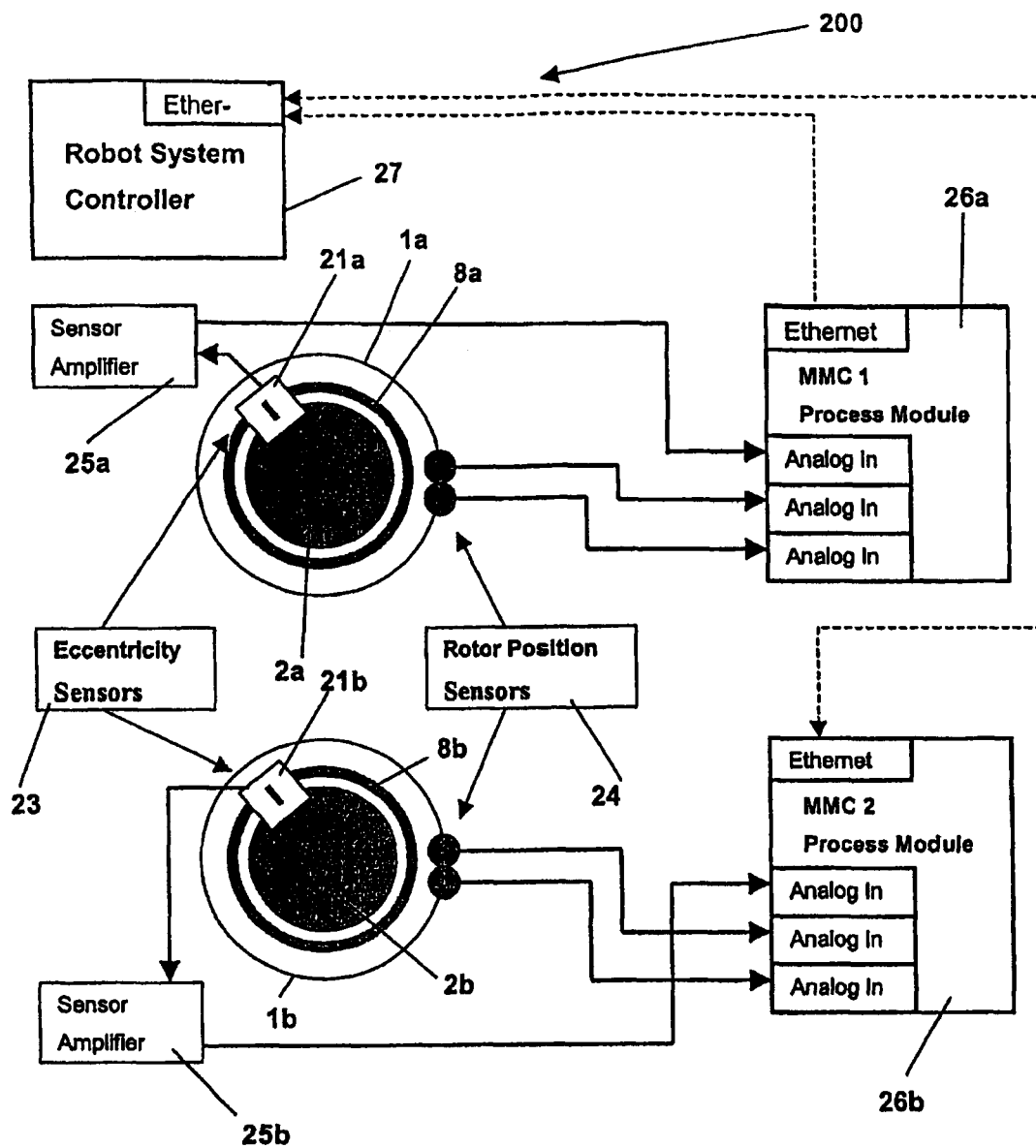
FIG. 2: a schematic illustration of a double chamber RTP plant and the signal flows for the light source signals and the receiver signals, as well as the direction of rotation detecting units.

FIG. 2 schematically shows a double chamber RTP plant 200 together with the signal flows from the eccentricity sensors 21a, 21b consisting of light sources and receivers as well as from the direction of rotation detecting units 24. The double chamber RTP plant 200 comprises two process modules incorporating the chambers 1a and 1b, and a respective rotation device upon which a wafer 2a and 2b can be positioned in each case. The guard rings 8a and 8b in the respective chambers 1a and 1b are likewise illustrated. Furthermore, there are also illustrated the direction of rotation detecting units 24 which determine the rotational state (e.g. the angular speed, the angular acceleration and the angle) of the respective rotation devices. Each process module is controlled by means of its own controller (MMC1 and MMC2) 26a, 26b so that an independent process, e.g. a temperature-time treatment of the respective wafer can be carried out in each process module. The two controllers 26a, 26b are connected to a robot control system 27. Furthermore, the robot control system 27 and the controllers 26a, 26b are connected to a central computer unit (not illustrated). Data exchange between the individual units is preferably made by means of an Ethernet connection.

The electrical signals detected by the receivers in the eccentricity sensors 21a, 21b are amplified e.g. by means of the amplifiers 25a, 25b (in order to obtain e.g. voltage signals within a range of between 0 V and 5 V) and then passed on to the respective module controllers 26a, 26b. In like manner, the data obtained by the direction of rotation sensor with respect to the rotational state of the individual rotary devices are conveyed to the respective controllers 26a, 26b. There, the of data from the eccentricity sensors are then combined with those from the direction of rotation sensors so as to obtain the positions of the wafers 2a, 2b on the rotation devices. Any displacements of the respective rotational axes are determined in like manner. These data are then supplied to the robot control system 27 which then effects a correction in such a manner that the wafers can be securely removed from the chambers 1a, 1b, and that the wafers are positioned as centrally as possible relative to the rotational axes when loading the chambers 1a, 1b.

In the exemplary embodiments discussed so far, the eccentricity sensors employ a transmitted light process, i.e. the light source 20 and the receiver 21 are arranged opposite one another with respect to the plane of the wafer whereby the light beam 22 emitted by the light source passes the edge of the wafer unimpeded to at least a partial extent. If the wafer 2 is not mounted on quartz pins but on a susceptor, then, in general, it is no longer possible to use a transmitted light process.

FIG. 3 shows alternative arrangements of the light source 20 and the receiver 21 for forming an eccentricity sensor when using a susceptor 15. The susceptor 15 is connected to the rotation device 3 by means of a holding device 16. The wafer 2 is mounted on the ring-shaped susceptor 15. Here, the wafer 2 and the susceptor 15 overlap at the boundary region of the wafer 2 since the susceptor 15 supports the wafer 2 in this area.

Figure 3A:
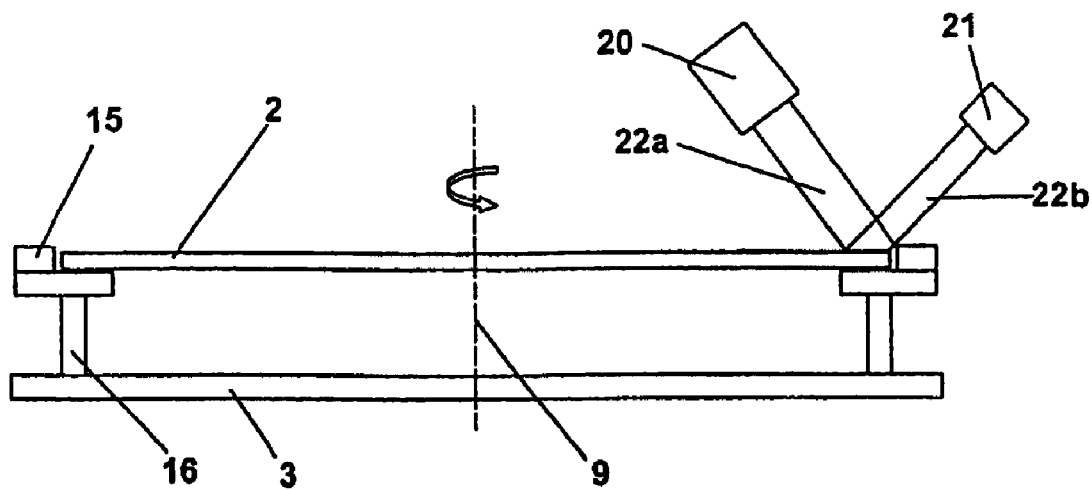
FIG. 3: alternative arrangements of the light source and the receiver for forming an eccentricity sensor when using a susceptor.

In FIG. 3a, a light beam 22a emitted by the light source 20 is directed towards the edge region of the wafer so that a part of the light beam 22a will pass the edge of the wafer in a direction towards the susceptor 15. Hereby, the angle of incidence of the light beam 22a is selected in such a way that the portions 22b of the light beam 22a that are reflected at the susceptor 15 and at the wafer 2 will reach a receiver 21. Now, as the reflective properties of the wafer 2 and the susceptor 15 generally differ, the same signal behaviour as for the transmitted light process presented above will occur, in a qualitative sense, in the receiver.

Figure 3B:
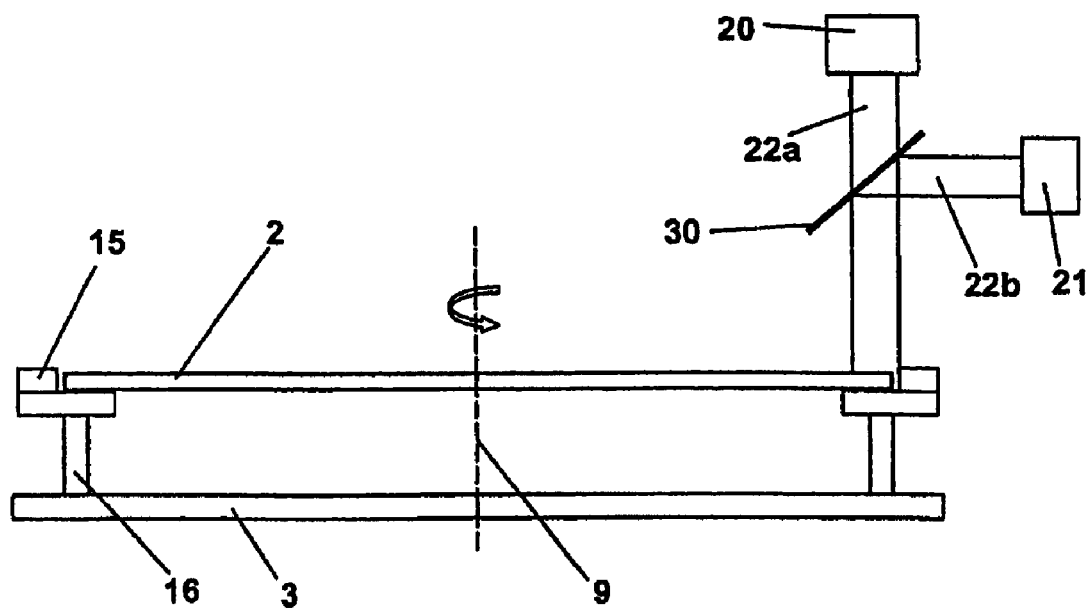

FIG. 3b shows a further exemplary embodiment of a device in accordance with the invention for determining the position of a wafer 2 on a rotation device 3. Here, the light beam 22a emitted by the light source 20 shines on the edge of the wafer in a direction that is approximately perpendicular to the plane of the wafer so that a part of the light beam will pass said edge to a partial extent and thereby reach the susceptor 15. The light 22b of the light beam 22a that is reflected back approximately perpendicularly therefrom is deflected onto a receiver 21 by means of an optical deflecting device (e.g. a partially transparent mirror) and is detected by the receiver in a quantitative manner. As has already been explained above, the wafer 2 and the susceptor 15 generally differ in regard to their reflective properties so that the position of the wafer 2 relative to the rotational axis 9 can be determined from the reflected beam in an analogous manner to that of the transmitted light process. A displacement of the rotational axis 9 can likewise be determined in an analogous manner to the transmitted light process by guiding a reflected light beam to the receiver instead of the directly transmitted light. The embodiment of FIG. 3b has the advantage that only one opening is necessary in the chamber 1 for the purposes of feeding in and extracting the light beam 22a and 22b.

For the purposes of determining the position of the wafer 2 on the rotation device 3 prior to and after a processing step, it is generally sufficiently to let the rotor of the rotation device rotate for approximately 2 revolutions when the light source 20 is switched on. Consequently, it can easily be established as to whether the wafer 2 is in the correct position with respect to the rotation device 3 before the beginning of a process. If the wafer 2 lies outside a tolerance range, then it can be replaced on the rotation device 3 by means of the robot using corrected robot coordinates. The process, e.g. a high temperature process in an RTP plant can then be started when the wafer 2 has been positioned correctly.

The position of the wafer 2 can likewise be determined again after the process in order to allow the robot to extract the wafer 2 in a defined manner. This has the advantage that the position of the wafer 2 is known for subsequent working steps so that the wafer can be placed e.g. centrally in a second chamber for further processing.

Figure 4:
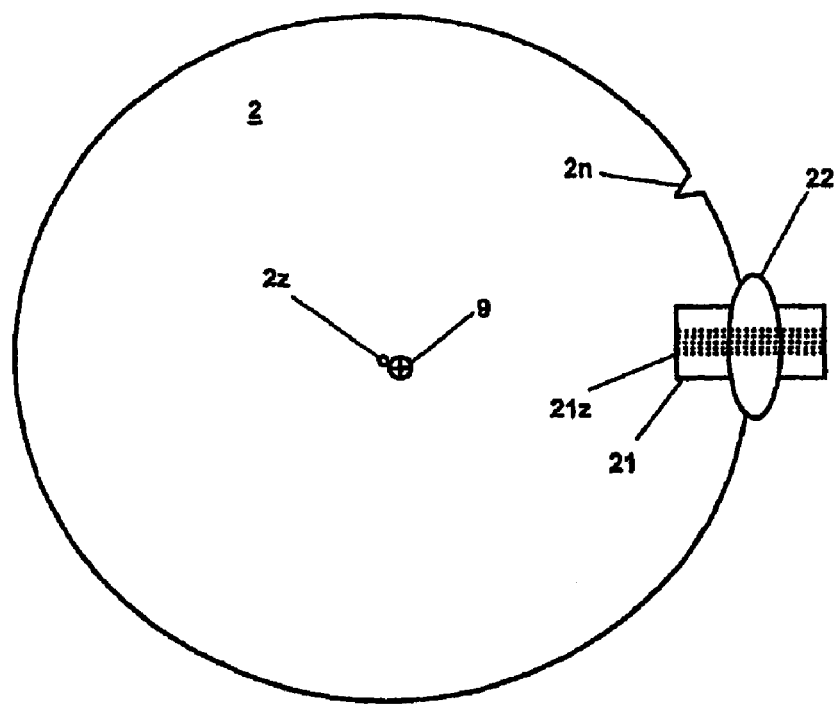
FIG. 4: a schematic plan view of a wafer lying on a rotation device together with a receiver and the cross section of a light beam.

In FIG. 4, there is illustrated a wafer 2 which is placed on a rotation device (not illustrated). Here, the rotational axis of the rotation device is designated by the reference 9 and the centre of the wafer by the reference $2z$. The rotational axis 9 and the centre of the wafer $2z$ do not coincide in the example shown, this thereby resulting in a signal at the receiver 21 which varies overtime. In addition, there is illustrated the notch $2n$ in the edge of the wafer which likewise causes a temporal variation in the receiver signal. The light beam 22 illustrated has an approximately elliptical cross section. In general, the cross section may be of any arbitrary shape, although the light beam 22 must be limited by the wafer 2 on its way to the receiver 21. Here, the receiver 21 is in the form of a spatially resolving receiver which comprises at least one linear CCD array $21z$ that is arranged approximately radially relative to the wafer. Preferably, a plurality of linear CCD arrays are disposed in parallel, i.e. a matrix-like CCD element is used as a receiver.

Figure 5:
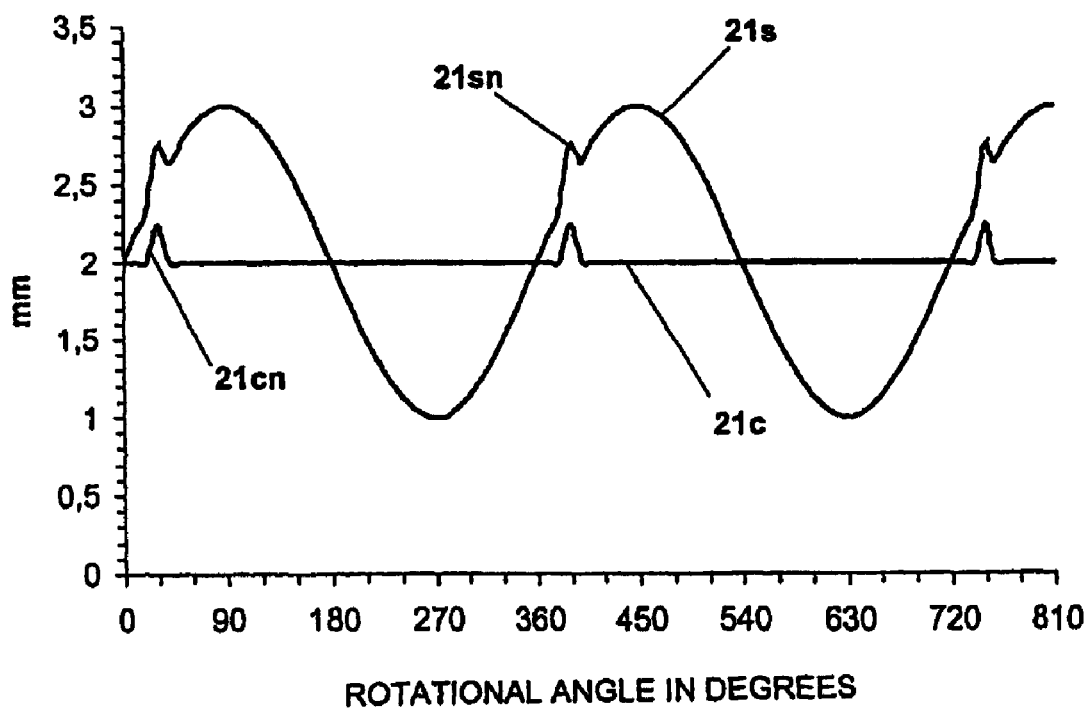
FIG. 5: a schematic illustration of a signal recorded by the receiver for the cases where the wafer is arranged centrally and where it is not arranged centrally relative to the rotational axis.

In FIG. 5, the receiver signal is represented as a function of the angle of rotation of the rotation device (i.e. of the wafer). Hereby, one obtains an approximately sinusoidal signal $21s$ in the case of an eccentric position of the wafer with respect to the rotational axis 9, as is indicated in FIG. 4. The influence of the notch is represented by $21sn$. If the wafer 2 is supported centrally on the rotation device, then one obtains a signal $21c$ which is almost constant over time and which merely exhibits slight variations $21cn$ over a limited narrow angular range due to the influence of the notch. Preferably, the receiver is calibrated e.g. by means of a calibration process in such a way that any possible eccentricity is determined directly in e.g. millimetres whereby an offset of 2 mm is set in the illustrated example.

If spatially resolving receivers 21 are used, then a spatial resolution of approximately 0.01 mm or better is selected.

The data processing sequences (program units) necessary for the control of the plant preferably comprise the following elements:

Three threshold values are preferably defined for controlling the further program sequence.
1. the deviation of the wafer (false positioning) from the central position is within the tolerance range or outside this range.
2. the false positioning requires a correction of the position of the wafer.
3. the rotation must be stopped because the false positioning is too large.
4. the relative variation of the receiver signal, but not the absolute value thereof serves as a measure for the eccentricity of the wafer (for the false positioning).
5. the variation of the receiver signal is correlated to the angle of rotation of the rotary device, whereby the zero point of the angle of rotation is likewise specified.
7. the influence of the notch or the flat is corrected.
8. data storage for the analysis of the plant and for the automatic correction of the plant (e.g. of the robot).
9. the adjusting sequence for the robot by using the data regarding the variation of the receiver signal as a function of the angle of rotation.

The automatic adjusting sequence for the robot can proceed e.g. in accordance with the following points:
1. manual adjustment with an accuracy of approximately 1 mm.
2. starting an automatic adjusting sequence. the robot places a wafer into the position from point 1.
2.2 the robot moves out of the chamber, following which the wafer effects approximately 2 (or more) revolutions.
2.3 the maximum variation of the receiver signal and of the associated angles is determined.
2.4 the robot removes the wafer from the chamber and puts it back into the chamber after being corrected, whereby the correction of the robot coordinates is effected by means of the values determined under 2.3.
2.5 the steps 2.2 to 2.4 are repeated until such time as the wafer lies within a tolerance range.

The embodiments of the invention specified above can be supplemented by such as result from an exchange and combination of the features of the individual embodiments.

The invention claimed is:

1. A device for determining the position of a semiconductor substrate on a rotation device having a rotational axis, said semiconductor substrate having a peripheral edge, said device comprising:
   a detecting unit for determining the rotational state of the rotation device;
   at least one light source, said at least one light source comprising a modulating device that produces a light beam having a specific variation over time;
   at least one receiver which is photo-sensitive to the light from the light source, said at least one receiver comprising a demodulating device configured to demodulate said light beam detected by said at least one receiver;
   wherein during rotation of said semiconductor substrate on said rotation device, said at least one light source emits a light beam toward said peripheral edge of said semiconductor substrate such that said light beam partially intersects and partially passes over said peripheral edge, and wherein said at least one receiver detects said light beam which has partially passed over said peripheral edge and determines whether there is any temporary variation over time in the intensity of said detected light beam.

2. The device of claim 1, wherein said at least one light source and said at least one receiver are arranged outside said process chamber, said light beam emitted from said at least one light source passing through at least one opening that is optically transparent to said light beam.

3. The device of claim 1, wherein said device further comprises a ring shaped object surrounding said semiconductor substrate.

4. The device of claim 3, wherein said ring shaped object is spaced from said semiconductor substrate.

5. The device of claim 1, wherein said at least one receiver produces a receiver signal responsive to said intensity of said light beam detected by said receiver.

6. The device of claim 5, wherein said device further comprises a processing unit that receives said receiver signal and produces an output signal comprising a measure for the position of the semiconductor substrate.

7. The device of claim 6, wherein said device further comprises a control unit, said control unit providing for the correction of said position of said semiconductor substrate based on said output signal of said processing unit.

8. The device of claim 1, wherein said device comprises at least two receivers arranged at an angle relative to said rotational axis.

9. The device of claim 1, wherein said device comprises at least one beam splitter configured to split the light beam emitted by the light source into at least two separate light beams.

10. The device of claim 1, wherein said device comprises at least two receivers arranged at an angle relative to said rotational axis and at least two light sources arranged at an angle relative to said rotational axis.

11. The device of claim 1, wherein said detecting unit comprises a transmitter and a receiving unit, said transmitter and receiving unit being spaced from said rotation device to avoid interference from said semiconductor substrate positioned on said rotation device.

12. The device of claim 1, wherein said detecting unit produces at least one signal when said semiconductor substrate is loaded or unloaded into said device.

13. The device of claim 1, wherein said at least one receiver comprises spatially resolving elements.

14. The device of claim 1, wherein said light beam has a defined beam profile.

15. The device of claim 14, wherein said light beam profile is between 2 mm and 6 mm at said peripheral edge of said semiconductor substrate.

16. A method for determining the position of a semiconductor substrate on a rotation device having a rotational axis, said semiconductor substrate having a peripheral edge, said method comprising:
   rotating said semiconductor substrate with said rotation device;
   determining the rotational state of the rotation device;
   generating with at least one light source comprising a modulating device a light beam having a specific variation over time;
   during rotation of said semiconductor substrate, emitting the light beam toward said peripheral edge of said semiconductor substrate such that said light beam partially intersects and partially passes over said peripheral edge;
   detecting with at least one receiver said light beam which has partially passed over said peripheral edge;

demodulating with a demodulating device the light beam detected by the at least one receiver; and determining whether there is any temporary variation over time in the intensity of said detected light beam.

17. The method of claim 16, wherein said semiconductor substrate is rotated through at least one revolution by the rotation device during the step of detecting said light beam, 18. The method of claim 16, wherein said method further comprises determining the position of said semiconductor substrate based at least in part on said detection of said light beam by said at least one receiver.

19. The method of claim 16, wherein said method comprises correcting said position of said semiconductor wafer based at least in part on said determined position of said semiconductor wafer.

* * * * *